United States Patent [19]

Sandhu

[11] Patent Number: 5,387,315
[45] Date of Patent: Feb. 7, 1995

[54] PROCESS FOR DEPOSITION AND ETCHING OF COPPER IN MULTI-LAYER STRUCTURES

[75] Inventor: Gurtej S. Sandhu, Boise, Id.

[73] Assignee: Micron Technology, Inc., Boise, Id.

[21] Appl. No.: 968,056

[22] Filed: Oct. 27, 1992

[51] Int. Cl.$^6$ ............................................. H01L 21/00
[52] U.S. Cl. ..................................... 156/646; 156/655; 156/656; 156/666; 427/99; 427/585; 427/252; 427/253; 437/187; 437/203; 437/228
[58] Field of Search ................. 156/643, 646, 656, 655, 156/666; 427/585, 587, 99, 124, 250, 252, 253; 437/203, 187, 228

[56] References Cited

U.S. PATENT DOCUMENTS

| | | | |
|---|---|---|---|
| 4,936,950 | 6/1990 | Doan et al. | 437/203 X |
| 4,948,623 | 8/1990 | Beach et al. | 427/252 X |
| 5,085,731 | 2/1992 | Norman et al. | 156/646 |
| 5,087,485 | 2/1992 | Cho | 427/253 |
| 5,098,516 | 3/1992 | Norman et al. | 427/250 X |
| 5,112,439 | 5/1992 | Reisman et al. | 156/646 X |

OTHER PUBLICATIONS

H. K. Shin et al, in Mat. Res. Soc. Proc., vol. 204, p. 61 (1991) "Synthesis Of New Copper (I) Beta-Diketonate Compounds For CVD Of Copper".

Primary Examiner—Thi Dang
Attorney, Agent, or Firm—Susan B. Collier

[57] ABSTRACT

An integral process is provided for depositing onto, and etching a layer of copper from, a multi-layer structure. The subject process, which is conducted within a vacuum chamber, comprises providing a multi-layer having at least one major surface in which contact/vias are located. Next, a copper precursor is deposited onto at least one major surface of the multi-layer structure and into the contact/vias. The substrate temperature of the multi-layer structure in the vacuum chamber is maintained above the decomposition temperature of the copper precursor during the deposition thereof. In the etching phase of the integral process, an protective etch mask is provided on the major surface. Then, the substrate temperature of the multi-layer structure is lowered in the vacuum chamber below the decomposition temperature of the deposited copper precursor. Etching of the deposited copper film is then conducted employing an etchant material comprising the decomposition product of the copper precursor. Preferably, etching of the deposited copper film from at least one of the major surfaces of the multi-layer structure comprises a reverse chemical vapor deposition and etching process.

7 Claims, 1 Drawing Sheet

PROCESS FOR DEPOSITION AND ETCHING OF COPPER IN MULTI-LAYER STRUCTURES

BACKGROUND OF THE INVENTION

This invention relates to a process for depositing and etching of copper in the formation of multi-layer structures, and more particularly to an integrated process for conducting such copper deposition and etching operations, particularly in the formation of semiconductor devices.

Copper would be useful in the metalization of multi-layer structures such as semiconductors and the like. A number of technology problems must be overcome before widespread use of copper can be achieved. For example, there is no reliable process for the deposition and etching of copper.

A CVD process has been employed for metalization of copper. In U.S. Pat. No. 5,087,485, for example, a copper diketone, such as hexafluoroacetylacetonate (hfac), is employed in a CVD process to coat a heated substrate with copper. An alcohol compound having an alpha hydrogen is used to catalyze the copper deposition. Various copper film deposition processes using copper(hfac) are outlined in U.S. Pat. No. 5,087,485, column 1, line 26 through column 2, line 7. A CVD process for the deposition of copper Cu(hfac) and vinyl-trimethylsilane is also provided in an article by H.K. Shin, et al in Mat. Res. Soc. Proc., Vol. 204, page 61 (1991) entitled "SYNTHESIS OF NEW COPPER(I) BETADIKETONATE COMPOUNDS FOR CVD OF COPPER".

Therefore, although processes for the deposition per se of copper are known, a need exists for a reliable integrated copper deposition and etching process.

SUMMARY OF THE INVENTION

The process of the present invention meets the above-described existing needs by providing a reliable copper deposition and etching process. This is accomplished employing an integrated process for depositing and etching copper, preferably for depositing copper plugs in-situ in contacts/vias, and etching back the deposited copper layer to form the requisite copper plugs therein.

An integral process is provided for depositing onto, and etching a layer of copper from, a multi-layer structure. The subject process comprises providing a multi-layer having at least one major surface located within a first vacuum chamber. Next, a copper precursor is introduced into the vacuum chamber. A copper film then is deposited onto at least one major surface of the multi-layer structure. The substrate temperature of the multi-layer structure in the vacuum chamber is maintained above the decomposition temperature of the copper precursor during the deposition of the copper film.

In the etching phase of the integral process, the substrate temperature of the multi-layer structure is lowered in the vacuum chamber below the decomposition temperature of the copper precursor. Etching of the deposited copper film is then conducted from the major surface of the multi-layer structure with an etchant material comprising the decomposition product of the copper precursor. Preferably, etching of the deposited copper film from at least one of the major surfaces of the multi-layer structure comprises a reverse chemical vapor deposition and etching process. The copper precursor preferably comprises a CVD etchant precursor material.

In the preferred forms of this invention, reverse chemical vapor deposition and etching processes are conducted by either reverse reaction (I) or (II).

Reverse reaction (I) comprises the following chemical reaction:

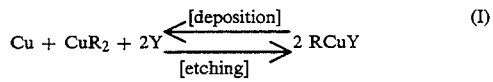

$$Cu + CuR_2 + 2Y \underset{\text{[etching]}}{\overset{\text{[deposition]}}{\rightleftharpoons}} 2\,RCuY \quad (I)$$

wherein preferably R=hexafluoroacetylacetonate and wherein preferably Y=vinyltrimethylsilane, triethyl phosphine, 1,5-cyclopentadiene, 2-butyne, pentyne, or bis-trimethylsilylacetylene, wherein deposition of copper occurs when the substrate temperature is above the decomposition temperature of $RCuY_2$, and wherein etching of copper occurs when the substrate temperature is below the decomposition temperature of $RCuY_2$. The most preferred material is bis-trimethylsilylacetylene. As for the copper precursor, it preferably comprises the hexafluoro-acetylacetonate copper reaction product of the aforementioned "Y" materials, most preferably hexa-fluoroacetylacetonate copper bis-trimethylsilylacetylene because of its high etch rate.

Preferred reverse reaction (II) comprises the following chemical reaction:

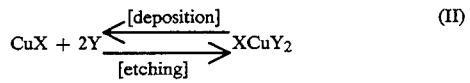

$$CuX + 2Y \underset{\text{[etching]}}{\overset{\text{[deposition]}}{\rightleftharpoons}} XCuY_2 \quad (II)$$

wherein preferably X=a halogen, preferably chlorine, and wherein preferably Y=P(CH$_3$)$_3$, P(C$_2$H$_5$)$_3$, P(i-C$_3$H$_8$)$_3$, P(CH(CH$_3$)$_2$)$_3$, and P(C$_4$H$_9$)$_3$, wherein deposition of the copper film occurs when the substrate temperature is above the decomposition temperature of $XCuY_2$, and wherein etching of the deposited copper film occurs when the substrate temperature is below the decomposition temperature of $XCuY_2$.

In another preferred form of the integral process for depositing onto, and etching a layer of copper from, a multi-layer structure, a first copper precursor, typically in the form of a first feed gas stream, is introduced into a vacuum chamber having a multi-layer structure located therewithin. This first copper precursor will deposit a copper film at a temperature above its decomposition temperature. A copper film of the first copper precursor is then deposited onto at least one major surface of the multi-layer structure. The substrate temperature of the multi-layer structure in the first vacuum chamber is maintained above the decomposition temperature of the first copper precursor during the deposition thereof. As previously stated, if the temperature in the chamber is lowered below the decomposition temperature of the first copper precursor, the deposited copper film will be etched by the decomposition products of the first copper precursor. Next, a second copper precursor, generally in the form of a second feed gas stream, is introduced into the vacuum chamber for etching the copper film. The substrate temperature in the vacuum chamber of the multi-layer structure can be lowered below the decomposition temperature of the second copper precursor. Etching of the deposited copper film from the major surface of the multi-layer structure is then conducted with an etchant material comprising the decomposition product of the second copper precursor. If the temperature of the substrate is above the decomposition temperature of the second copper precursor, a copper film from the second copper precursor will be deposited.

In another preferred form of this invention, deposition and etching processes are conducted by he following chemical reaction (III) or (IV), reaction (III) comprising the following:

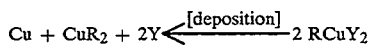

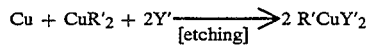

wherein deposition of a copper film occurs when the substrate temperature is above the decomposition temperature of $RCuY_2$, and wherein etching of the copper film occurs when the substrate temperature is below the decomposition temperature of $R'CuY'_2$. Preferably, either or both of R and R' is hexafluoroacetylacetonate, and either or both of Y and Y' is selected from the group consisting of vinyltrimethylsilane, triethyl phosphine, 1,5-cyclopentadiene, 2-butyne, pentyne, and bis-trimethylsilylacetylene. The copper precursor used in either or both of the deposition and etching steps most preferably comprises hexafluoroacetylacetonate copper bis-trimethylsilylacetylene.

Reaction (IV) comprises the following preferred chemical reactions:

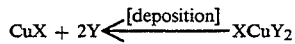

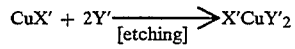

In this reaction, X and X' is preferably a halogen, and either or both Y and Y' is preferably selected from a group consisting of $P(CH_3)_3$, $P(C_2H_5)_3$, $P(i-C_3H_8)_3$, $P(CH(CH_3)_2)_3$, and $P(C_4H_9)_3$. Moreover, the deposition of a copper film occurs when the substrate temperature is above the decomposition temperature of $XCuY_2$, and etching of the copper film occurs when the substrate temperature is below the decomposition temperature of $X'CuY'_2$.

Etching of the copper film is typically conducted in situ in the first vacuum chamber. However, the etching of the copper film can also be conducted in a different chamber or in situ in a plurality of vacuum chambers.

A specific integral process can be also be provided for producing a multi-layer structure by depositing onto, and etching back a layer of copper from, a multi-layer structure. In this form of the invention, the deposited copper film is etched back from the major surface of the multi-layer structure with an etchant material comprising the decomposition product of the copper precursor. Preferably, prior to the deposition of the copper film, a dielectric layer is deposited on the major surface of the multi-layer structure. Lines, contact/vias or grooves are then located in the dielectric or multi-layer structure, and the copper layer is deposited thereon as set forth above. The deposited copper film is etched back to form copper plugs in the contact/vias or copper lines in the grooves or on the surface of the multi-layer structure.

The process can be conducted employing a chemical etchant protective patterned layer having a predetermined pattern of openings formed on the deposited copper film. In this way, a plurality of predetermined pattern of openings are formed in the major surface of the copper film. Etching of the exposed plurality of predetermined openings of the deposited copper film is then conducted in which a predetermined etch pattern is formed therein.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
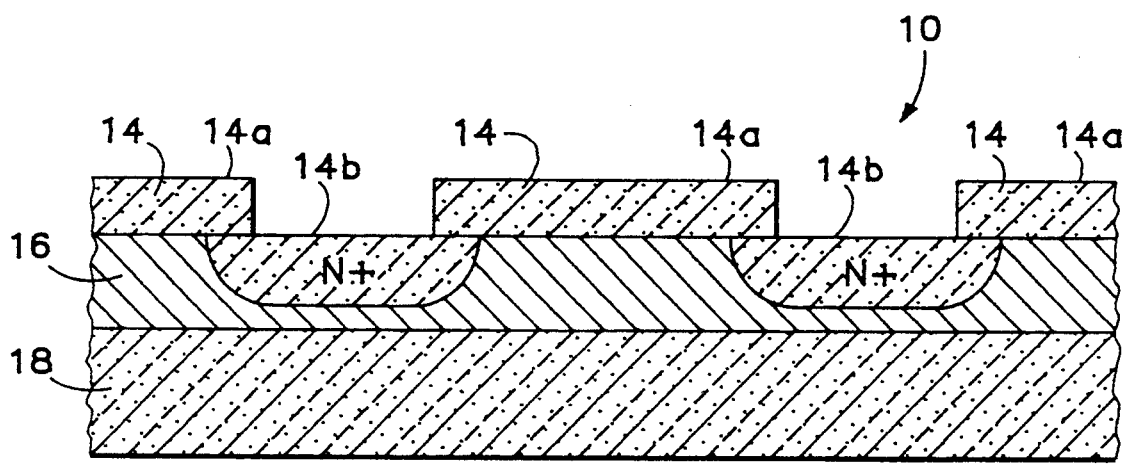
FIG. 1 is a pictorial representation of multi-layer structure prior to copper deposition step.

Referring now to FIG. 1, a schematic representation of a multi-layer structure, generally designated as "10", is depicted. The subject multi-layer structure comprises a plurality of structural layers, denoted "14" and "16" which are sequentially deposited onto an underlying silicon structure 18. As shown in FIG. 1, a multi-layer structure 10 is first formed which comprises a plurality of structural layers including an outer dielectric layer 14, preferably a $SiO_2$ or $Si_3N_4$ layer. Dielectric layer 14 comprises a major outer surface 14a having contact/vias (or lines not shown) 14b located therewithin. Contact/via 14b is typically formed in a vacuum chamber by forming a etchant protective mask onto the surface 14a having a predetermined pattern of openings in the form of the requisite contact/via 14b. Then, the exposed areas of the major outer surface 14a of multi-layer structure 10 corresponding to the predetermined pattern are etched employing conventional dry or wet etching techniques.

Figure 2:
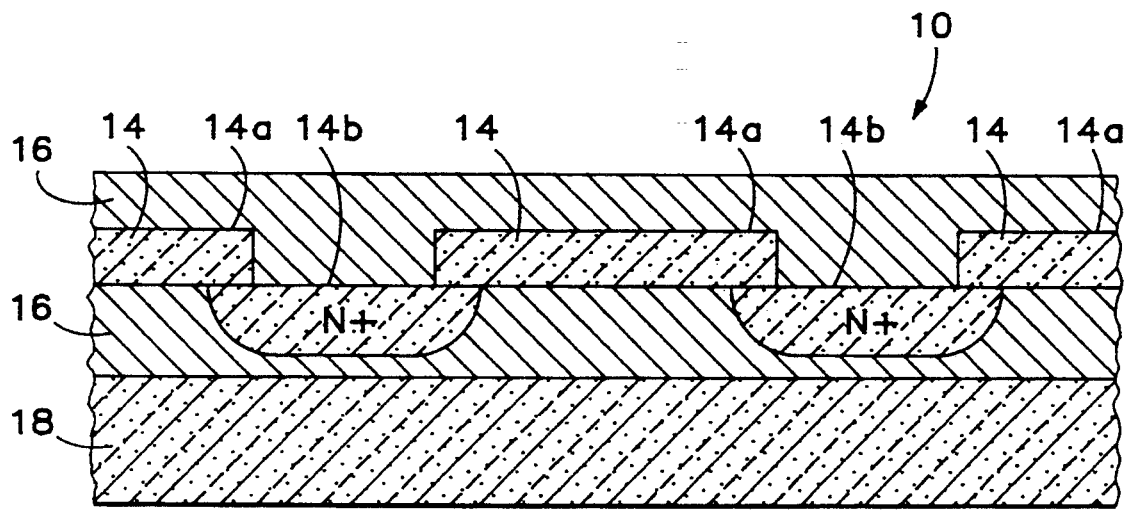
FIG. 2 is a pictorial representation of multi-layer structure after copper deposition step.

Next, in the integrated process for deposition and etchback of copper in the contact/vias 14b, a copper precursor is introduced into the vacuum chamber and a layer of copper 16 is deposited onto major outer surface 14a of outer dielectric layer 14 and into the contact/vias 14b. Although other methods of depositing copper can also be employed, this can preferably be accomplished, for example, by introducing a copper hexafluoroacetylacetonate material, such as those previously described herein, into the vacuum chamber while maintaining the temperature of the multi-layer structure 10 at a substrate temperature above it's decomposition temperature. In the case of copper hexafluoro-acetylacetonate bis-trimethylsilylacetylene, for instance, decomposition is at a temperature greater than 250 degrees C., typically up to 500 degrees C. The copper hexafluoroacetylacetonate material can be diluted in the subject process in $H_2$, and the pressure maintained in the vacuum chamber at about 500 mTorr., although a one mTorr to 760 Torr range can generally be employed. After deposition process is complete, the surface of the multi-layer structure 10 is coated with a layer of copper as depicted in FIG. 2, and the contact/vias 14b are filled with copper.

Finally, the copper deposited onto major surface 14a is removed by etching. More particularly the deposited copper is removed by etching back or blanket etching a portion of the copper layer 16 from the multi-layer structure surface. This etch back or blanket etching process can be accomplished in the vacuum chamber employed in the copper deposition step, or it can be done in an auxiliary vacuum chamber.

Figure 3:
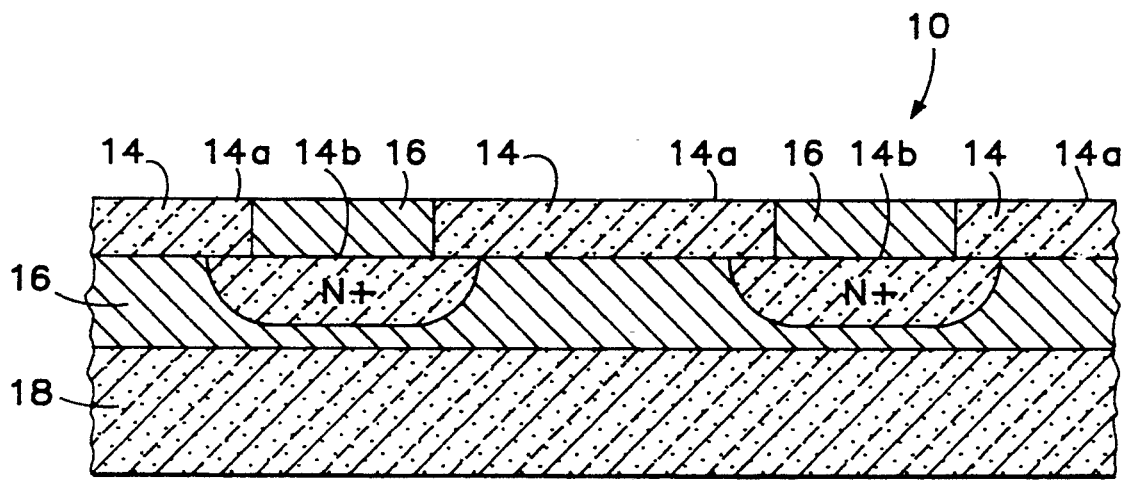
FIG. 3 is a pictorial representation of multi-layer structure after copper etch back step.

Next, a chemical etchant protective patterned layer having a predetermined pattern of openings is formed on the deposited copper film. Etching of the copper deposited on major surface 14a is then conducted by lowering the temperature of the multi-layer structure to a substrate temperature less than the decomposition temperature of the copper hexafluoroacetylacetonate bis-trimethylsilylacetylene. Thus, the copper hexafluoro-acetylacetonate bis-trimethylsilylacetylene layer 16 is chemically decomposed into its constituent components, namely, copper, copper hexafluoroacetylacetonate and bis-trimethylsilylacetylene, and etching is conducted insitu by a reverse CVD process. The final multi-layer structural product, after the etching step is completed, is shown in FIG. 3.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. An integral process for depositing copper onto and etching copper from a multi-layer structure having at least one major surface, comprising:
   placing the multi-layer structure in a vacuum chamber;
   introducing a copper precursor of $XCuY_2$ into the vacuum chamber wherein X is a halogen and wherein Y is selected from a group consisting of $P(CH_3)_3$, $P(C_2H_5)_3$, $P(i-C_3H_8)_3$, $P(CH(CH_3)_2)_3$ and $P(C_4H_9)_3$;
   depositing onto the at least one major surface of the multi-layer structure a film comprising copper from the copper precursor, a temperature of the multi-layer structure in the vacuum chamber being maintained above a decomposition temperature of the copper precursor during the step of depositing;
   introducing a decomposition product of the copper precursor, 2Y, into the vacuum chamber;
   lowering the temperature of the multi-layer structure in the vacuum chamber below the decomposition temperature of the copper precursor;
   etching at least a portion of the deposited film on the at least one major surface of the multi-layer structure with an etchant material comprising the decomposition product.

2. The process of claim 1, wherein the etching of the film is conducted in situ in said vacuum chamber.

3. The process of claim 1, further comprising the steps of:
   prior to the deposition of the film comprising copper, depositing a dielectric layer to overlie the multi-layer structure;
   etching at least a portion of said dielectric layer to expose a contact area of the at least one major surface of the multi-layer structure, such that the deposited film comprising copper contacts the contact area.

4. The process of claim 1, further comprising the steps of:
   prior to the deposition of the film comprising copper, depositing a dielectric layer to overlie the multi-layer structure;
   etching at least a portion of the dielectric layer and at least a portion of the at least one major surface thereby forming a vias in the at least one major surface of the multi-layer structure; and
   filling the vias with the deposited film comprising copper.

5. An integral process for producing a multi-layer structure having at least one major surface by depositing copper onto the etching copper from the multi-layer structure, comprising:
   depositing a dielectric layer to overlie structure;
   etching at least a portion of said dielectric layer to expose a contact area of the at least one major multi-layer structure;
   placing the multi-layer structure in a vacuum chamber;
   depositing in-situ onto the contact area of the at least one major surface of the multi-layer structure a film comprising copper from a copper precursor of $XCuY_2$, wherein X is a halogen and wherein Y is selected from a group consisting of $P(CH_3)_3$, $P(C_2H_5)_3$, $P(i-C_3H_8)_3$, $P(CH(CH_3)_2)_3$, and $P(C_4H_9)_3$, when a temperature of the multi-layer structure in the vacuum chamber is maintained above a decomposition temperature of the copper precursor;
   introducing a decomposition product of the copper precursor, 2Y, into the vacuum chamber;
   lowering the temperature of the multi-layer structure in the vacuum chamber below the decomposition temperature of the copper precursor; and
   etching at least a portion of the deposited film from the at least one major surface of the multi-layer structure with an etchant material comprising the decomposition product of the copper precursor.

6. An integral process for depositing copper onto and etching copper from a multi-layer structure having at least one major surface, comprising:
   placing the multi-layer structure in a vacuum chamber;
   introducing a first copper precursor of $XCuY_2$ into the vacuum chamber, wherein X is a halogen and wherein Y is selected from a group consisting of $P(CH_3)_3$, $P(C_2H_5)_3$, $P(i-C_3H_8)_3$, $P(CH(CH_3)_2)_3$, and $P(C_4H_9)_3$;
   depositing onto the at least one major surface of the multi-layer structure a film comprising copper from the first copper precursor when a temperature of the multi-layer structure in the vacuum chamber is maintained above a decomposition temperature of the first copper precursor;
   introducing an etchant material of 2Y' into the vacuum chamber, wherein Y' is selected from a group consisting of $P(CH_3)_3$, $P(C_2H_5)_3$, $P(i-C_3H_8)_3$, $P(CH(CH_2)_2)_3$, and $P(C_4)H_9)_3$;
   adjusting the temperature of the multi-layer structure in the vacuum chamber to a value below a decomposition temperature of a second copper precursor of $X'CuY'_2$, wherein X' is a halogen; and
   etching the deposited film from the at least one major surface of the multi-layer structure with said etchant material; and creating the second copper precursor during said etching.

7. An integral process for depositing copper onto and etching copper from a structure, comprising the following steps:

depositing at least one layer overlying a substrate;

patterning said layer to define further openings in said layer;

etching said layer to form a pattern for said copper, said step of etching forming said openings, said layer and said substrate forming the structure;

placing the structure in a vacuum chamber;

introducing a first copper precursor into the vacuum chamber;

maintaining a temperature of the structure in the vacuum chamber at or above a decomposition temperature of the first copper precursor;

depositing the copper to overlie said layer and to fill said openings;

introducing a further precursor into the vacuum chamber;

creating a reaction between the copper and said further precursor to etch the copper from a surface of said layer while retaining the copper in said openings; and forming a second copper precursor during etching of the copper from the surface of said layer, said second copper precursor having a decomposition temperature different than said decomposition temperature of the first copper precursor during the reaction.

* * * * *